United States Patent [19]

Farwell et al.

[11] Patent Number: 5,731,726
[45] Date of Patent: Mar. 24, 1998

[54] CONTROLLABLE PRECISION ON-CHIP DELAY ELEMENT

[75] Inventors: William D. Farwell, Thousand Oaks; Bradley S. Henson, Lakewood, both of Calif.

[73] Assignee: Hughes Electronics, Los Angeles, Calif.

[21] Appl. No.: 725,192

[22] Filed: Sep. 13, 1996

Related U.S. Application Data

[63] Continuation-in-part of Ser. No. 452,628, May 25, 1995, abandoned.

[51] Int. Cl.⁶ .................................................. H03H 11/26
[52] U.S. Cl. .................................... 327/277; 327/284
[58] Field of Search .................................. 327/149, 158, 327/161, 269–272, 276–278, 284, 285, 407

[56] References Cited

U.S. PATENT DOCUMENTS

| | | | |
|---|---|---|---|
| 5,095,233 | 3/1992 | Ashby et al. | 327/277 |
| 5,192,886 | 3/1993 | Wetlaufer | 327/277 |
| 5,570,294 | 10/1996 | McMinn et al. | 327/270 |
| 5,670,904 | 9/1997 | Moloney et al. | 327/277 |

*Primary Examiner*—Timothy P. Callahan
*Assistant Examiner*—My-Trang Nu Ton
*Attorney, Agent, or Firm*—Leonard A. Alkov; Wanda K. Denson-Low

[57] ABSTRACT

A controllable precision delay line implemented in a digital integrated circuit device including a counter circuit for measuring a representative propagation delay for a delay element in the digital integrated circuit, and a binary controlled digital delay line responsive to the counter circuit and including L delay stages respectively having $2^0$ through $2^{L-1}$ delay elements, wherein the delay stages are controllably switched into a delay path pursuant to the measured representative propagation delay. Preload connections are provided between the outputs of delay elements of stages S(0) through S(L–2) and inputs of delay elements of the next in sequence stages S(1) through S(L–1) to prevent glitches being imposed on the delayed signal during adjustments in the number of stages included in the delay path.

4 Claims, 2 Drawing Sheets

CONTROLLABLE PRECISION ON-CHIP DELAY ELEMENT

This is a continuation-in-part of application Ser. No. 08/452,628, filed May 25, 1995, now abandoned.

BACKGROUND OF THE INVENTION

The subject invention is generally directed to timing circuitry for digital integrated circuit devices, and more particularly to a controllable precision on-chip delay line that is implemented in a digital integrated circuit device and is useful for generating timing or clock signals for the digital integrated circuit device. Clock signals with any specified pulse width or phase relationships can be generated by fixed delays that are responsive to a single clock signal.

Timing signals for digital integrated circuit devices are typically generated off-chip; namely, by circuitry external to the integrated circuit chip that implements a digital integrated circuit device. Digital integrated circuits typically commonly require a plurality of different timing signals, and considerations with the use of externally generated timing signals include clock skew, as well as the need to pre-define all clock signals at the inception of a design of a digital system incorporating a plurality of digital integrated circuit devices. Also, upgrade of a digital system becomes difficult and complex where a new digital device requires different timing signals.

SUMMARY OF THE INVENTION

It would therefore be an advantage to provide an on-chip controllable precision delay line that is useful for generating timing signals for a digital integrated circuit device in which the controllable precision delay line is implemented.

Another advantage would be to provide a precision on-chip controllable delay line which provides a delay that remains accurate and constant with processing variations between integrated circuits and with variations in operating conditions.

A further advantage would be to provide a digitally programmable on-chip precision delay line that is useful for generating timing signals for a digital integrated circuit device in which the precision delay line is implemented and whose delay can be changed without changing the circuitry of the integrated circuit device, whereby timing signals can be adjusted to accommodate new timing requirements.

Another advantage would be to provide a digitally programmable on-chip precision delay line wherein change in the length of the delay line (whether to maintain delay constant during changing operating conditions or to set a new delay time) does not corrupt a signal propagating through the delay line. Particularly, a length change should not generate a spurious state transition (i.e., a glitch) on the delayed signal.

The foregoing and other advantages are provided by the invention a precision delay line implemented in a digital integrated circuit device and including a counter circuit for measuring a representative propagation delay for a reference delay line comprised of N delay elements in the digital integrated circuit, and a binary controlled digital delay line responsive to the counter circuit and including L delay stages S(0) through S(L−1) respectively having $2^0$ through $2^{L-1}$ delay elements, wherein the delay stages are controllably switched into a delay path pursuant to the measured representative propagation delay, and preloading connections between delay stage S(I) and S(I+1) for I equal to 0 through L−2.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
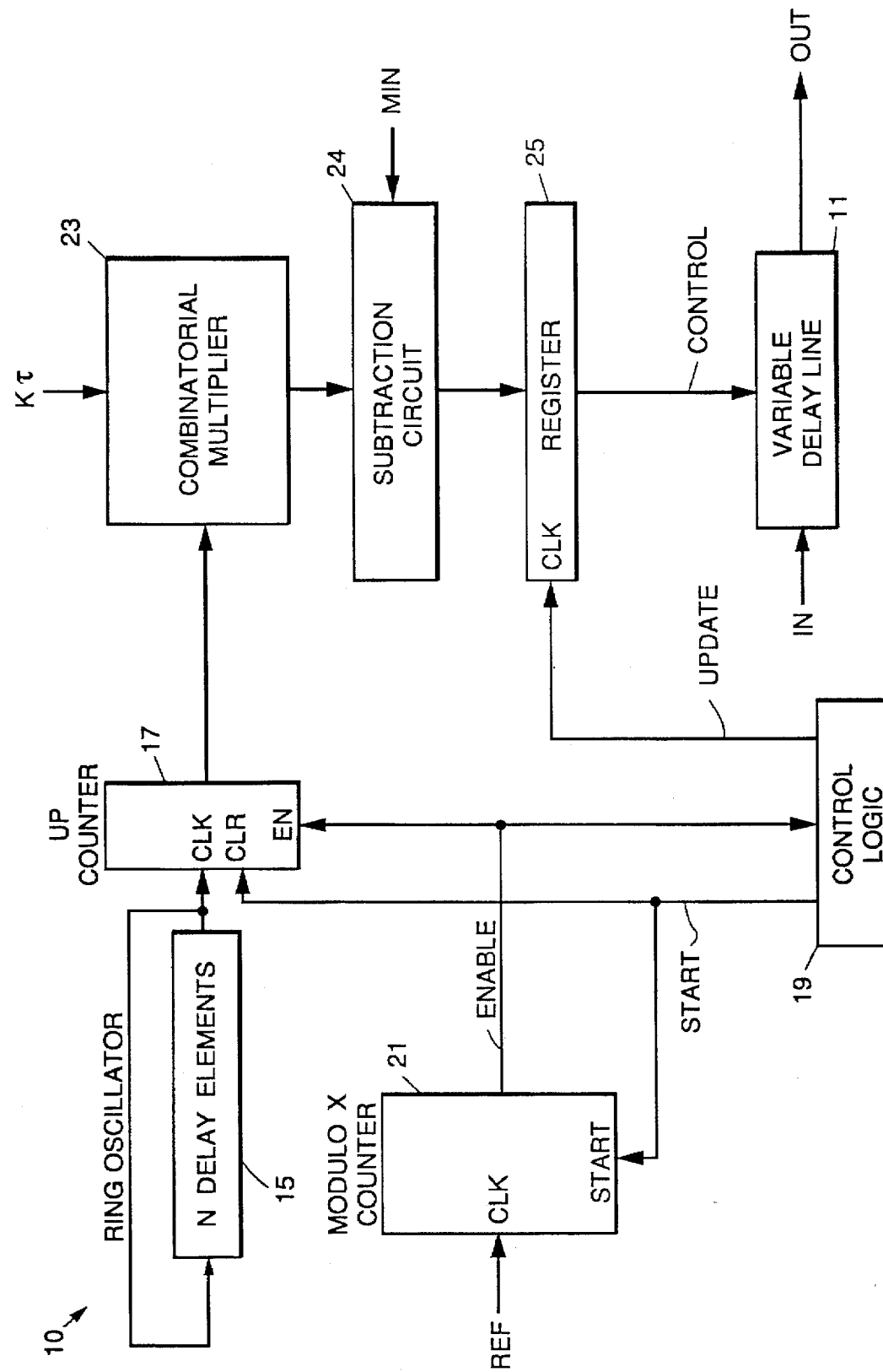
FIG. 1 is schematic diagram of a controllable delay line circuit in accordance with the invention.

In the following detailed description and in the several figures of the drawing, like elements are identified with like reference numerals.

Referring now to FIG. 1, set forth therein is a schematic diagram of a controllable delay line circuit which in accordance with the invention is implemented in a digital integrated circuit device for generating timing signals for such device. The controllable delay line circuit includes a binary controlled digital variable delay line 11 which receives an input signal IN at its input and provides an output signal OUT at its output. The output signal OUT is a delayed replica of the input signal IN, and the digital variable delay line is controlled to provide a selected fixed application delay (i.e., the delay between the IN and OUT signals) that remains substantially constant at the selected value. In particular, the number of delay elements of the delay line 11 included between the input signal IN and the output signal OUT is periodically adjusted such that the selected application delay remains substantially constant with variations in the delays of the delay elements of the variable delay line 11.

The timing generator of FIG. 1 further includes a ring oscillator 10 comprised of N serially connected, inverting delay elements 15, where N is an odd number. The N delay elements 15 have propagation delay characteristics that are substantially identical to the propagation delay characteristics of the delay elements of the variable delay line 11. Preferably, the delay elements of the variable delay line 11 and the N delay elements 15 of the ring oscillator 10 are constructed identically and are adjacent each other in the digital integrated circuit in which the timing generator of FIG. 1 is implemented, such that such elements have substantially identical delay variation characteristics.

The output of the ring oscillator 10 is provided to the clock input CLK of an up counter 17 which receives from control logic 19 a START pulse at its clear input CLR. The control logic 19 is configured to provide a START pulse at times when the propagation delay of the delay elements in the ring oscillator 10 is to be measured in preparation for updating the delay provided by the variable delay line 11. As described more fully herein, the control logic 19 further provides an UPDATE signal to cause an update of the delay provided by the variable delay line 11 pursuant to the measured propagation delay of the N delay elements 15 of the ring oscillator 10.

The up counter 17 further receives at its EN input an ENABLE signal that is provided by a modulo X counter 21 which receives a frequency reference signal REF at its clock input CLK and the START pulse at its START input. The external frequency reference signal is provided by a source external to the digital integrated circuit in which the timing generator of FIG. 1 is implemented, for example by a crystal oscillator.

Pursuant to the leading edge of a START pulse, the output of the up counter 17 is cleared, and pursuant to the trailing edge of the START pulse the modulo X counter 21 generates an ENABLE pulse having a width that is equal to X/F, wherein X is an integer and F is the frequency of the frequency reference signal REF. In other words, the ENABLE pulse has a width that is equal to X cycles of the frequency reference signal REF. The up counter 17 is enabled for the duration of the ENABLE pulse, and since the output of the up counter 17 was cleared prior to the ENABLE pulse, the output count Y of the up counter 17 at the end of the ENABLE pulse is a count of the number of cycles of the output of the delay line ring oscillator that occurred during the presence of the ENABLE pulse. Effectively, the ENABLE pulse defines a sample period and the Y output of the up counter 17 is a count of the number of cycles of the ring oscillator output which occurred during such sample period.

Since the modulo X counter 21 is clocked with a fixed reference frequency, the ENABLE pulse provides a fixed sample period, and thus the output count Y of the up counter 17 will vary only as a function of changes in the average delay of the N inverting delay elements 15 of the ring oscillator 10. In particular, the average delay of each of the N inverting delay elements of the ring oscillator is determined from the up counter output Y as follows. Since the total delay provided by the N delay elements is $N*te$, where te is the average delay of each of the N delay elements of the ring oscillator, the output of the oscillator is 1 for a time interval of $N*te$ and 0 for a time interval of $N*te$, and thus the period of the output of the ring oscillator is $2*N*te$. Since the sample period is F/X, and since the number of cycles of the ring oscillator output that occurred during the sample period is Y, the relation between the sample period and the number of cycles of the ring oscillator that occurred during the sample period is:

$$2*N*Y*te=X/F$$

Solving for the average delay te of each delay element provides:

$$te=X/(2*N*Y*F)$$

As described more fully herein, the average delay element delay te as measured by the ring oscillator is utilized to select the number of delay elements in the variable delay line that are switched into the delay path between the input and the output of the variable delay line. It is noted the resolution of the setting of the variable delay line 11 is delay element, and the accuracy of the setting depends on how closely the individual delay elements of the variable delay line match the average delay te measured by the ring oscillator delay line.

The count output Y of the up counter 17 is provided to a combinatorial multiplier 23 which multiplies the count output Y by a multiplier value $K\tau$ which is input to the multiplier from a source external to the multiplier, where $\tau$ is the desired delay to provided by the variable delay line 11, and K is a constant that is selected such that the output $Y*K\tau$ of the multiplier 23 is the number of delay elements of the variable delay line 11 that are needed to achieve the desired delay $\tau$. The multiplier $K\tau$ input to the multiplier 23 programs the delay element to provide the selected delay $\tau$, and is more particularly selected as follows. The desired delay $\tau$ to provided by the variable delay line 11 can be expressed as:

$$\tau=m*te=X/(2*N*Y*F)$$

where m is the number of delay elements that need to be in the delay path between the input and the output of the variable delay line 11 to provide the desired delay $\tau$. Solving for m provides:

$$m=[(2*N*F*\tau)/X]*Y$$

Since it is desired that $Y*K\tau$ equal the required number of delay elements m that will produce a delay of $\tau$, the constant K is:

$$K=2*N*F/X$$

The output $Y*K\tau$ of the multiplier 23 comprises a multiple bit word, and is provided to a substraction circuit 24 which subtracts MIN therefrom to provide an output $(Y*K\tau-MIN)$, wherein MIN is the minimum number of delay elements that must be in the delay path between the input and the output of the variable delay line 11. That is, the number of elements in the delay path of the variable delay line cannot be less than MIN, whereby the minimum delay that the variable delay is capable of providing is $MIN*te$. The output of the subtraction circuit 24 is provided to a buffer register 25 which receives at its clock input CLK an UPDATE pulse from the control logic 19. The control logic 19 generates the UPDATE pulse pursuant to the trailing edge of the ENABLE pulse, whereby the output of the subtraction circuit 24, which is equal to $(Y,K\tau-MIN)$, is stored in the buffer register 25 subsequent to the end of the sample period defined by the ENABLE pulse.

The output of the buffer register 25 comprises an L-bit binary CONTROL word having bits C(0) through C(L−1), wherein C(0) is the LSB (least significant bit) and C(L−1) is the MSB (most significant bit), and is provided to the variable delay line 11 to select the number of delay elements in the delay path between the input and the output of the variable delay line 11. In response to the binary CONTROL word, the variable delay line switches $(Y*K\tau-MIN)$ delay elements into the delay path between the input and the output of the variable delay line 11, such that the total number of delay elements in the delay path between the input and output of the variable delay line 11 is $Y*K\tau$, taking into account the minimum number MIN of delay elements that must be in the delay path. In view of the minimum number of elements MIN that must be in the delay path, $Y*K\tau$ must be greater than or equal to MIN.

Figure 2:
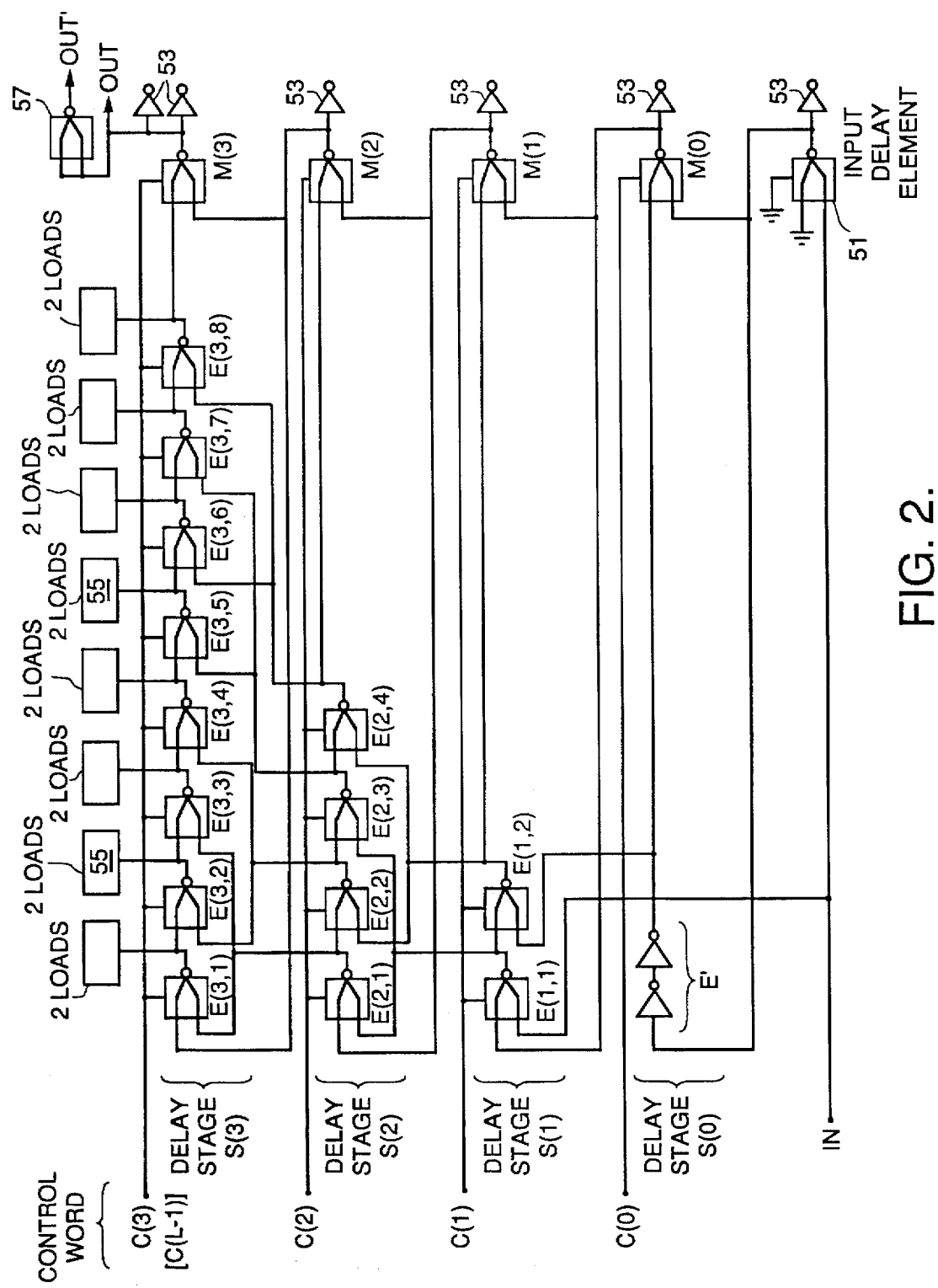
FIG. 2 is a schematic diagram of the binary controlled variable delay line of the controllable delay line circuit FIG. 1.

Referring now to FIG. 2, schematically illustrated therein is an illustrative example of a binary controlled variable delay line that can be utilized in the circuit of FIG. 1. The binary controlled delay variable delay line of FIG. 2 includes a plurality of delay stages S(I) arranged in a sequence wherein each delay stage is more particularly identified as delay stages S(0) through S(L−1) which are respectively controlled by corresponding bits of an L-bit CONTROL word provided by the buffer register 25. FIG. 2 depicts a delay line for the particular example wherein L is 4. Each of the delay stages S(I) includes $2^I$ delay elements, where I is the stage number. In particular, the first stage S(0) includes one delay element E' which is comprised of two serially connected inverters, while each of the stages S(1) through S(L−1) includes $2^I$ serially connected delay elements E(I,J) which are comprised of inverting multiplexers, where J is equal to 1 through $2^I$ and I is the stage number. The single delay element E' of the first delay stage is implemented as two serially connected inverters to avoid an inversion that would result if an inverting multiplexer were utilized. Each of the elements E' and E(I,J) has substantially the same delay te as each of the delay elements of the ring oscillator 10 of FIG. 1. Each of the delay stages S(1) through S(L-1) thus includes an input inverting multiplexer that receives the input to the respective delay stage and an output inverting multiplexer that provides the output of the respective delay stage. Within each delay stage S(1) through S(L-1), each delay element E(I,J) that receives an input from a delay element in the same stage receives such input at its 1 input. The output of the delay stage S(0) is provided by the output of the serially connected inverters. The select inputs of the delay elements of each delay stage S(I), for I equal to 1 through (L-1), are connected to the bit C(I) of the L-bit CONTROL word. As indicated earlier, the L-bit CONTROL word includes bits C(0) through C(L-1) wherein C(0) is the LSB and C(L-1) is the MSB.

The outputs of the delay elements of each of the stages S(0) through S(L-1) are further connected as follows:

(1) The output of the delay element E of the first stage S(0) is connected to the 0 input of the second delay element E(1,2) of the second delay stage S(1).

(2) The outputs of the odd numbered delay elements E(I, $J_{odd}$) of the delay stage S(I), for I equal to 1 through (L-2), are connected to delay element numbers E(I+1, $2*J_{odd}-1$) and E(I+1, $2*J_{odd}+1$) of the delay stage S(I+1), where $J_{odd}$ identifies the odd numbered delay elements of the delay stage S(I).

(3) The outputs of the even numbered delay elements E(I, $J_{odd}$) of the delay stage S(I), for I equal to 1 through (L-2), are connected to delay element numbers E(I+1, $2*J_{even}-2$) and E(I+1, $2*J_{even}$) of the delay stage S(I+1), where $J_{even}$ identifies the even numbered delay elements of the delay stage S(I).

(4) The outputs of the delay elements E(L-1,J) of the delay stage S(L-1) are respectively connected to 2 loads 55 that provide the same load characteristics as two of the inverting multiplexers utilized as the delay elements in the delay stages S(1) through S(L-1).

In this manner, the connections of the outputs of the delay elements of the stages S(1) through S(L-2) to the 0 inputs of delay elements of the next in sequence delay stage for provide pre-loading paths as discussed more particularly herein. Also, each delay element of the stages S(1) through S(L-1) sees 3 output loads, one in the delay stage in which is contained, and 2 loads which are in a next in sequence delay stage or provided by additional loads 55 in the case of the last in sequence delay stage S(L-1).

The input signal IN for the variable delay line is provided to the 0 input of an input inverting multiplexer 51, and to the 0 input of the first delay element E(1,1) of the second delay stage S(1). The 1 input of the input inverting multiplexer 51 is connected to ground, and the output of the input inverting multiplexer 51 is connected to the input of a load inverter 53 and the input of the delay element E' of the first delay stage S(0).

Respectively associated with the stages S(0) through S(L-1) are control multiplexers M(0) through M(L-1).

The first control multiplexer M(0) has its 1 input connected to the output of the first delay stage S(0), and its 0 input connected to the output of the input multiplexer 51. The output of the first control multiplexer is connected to the input of a load inverter 53 and the 1 input of the first input multiplexer delay element E(1,1) of the second delay stage S(1). The select input of the first control multiplexer receives the first control bit C(0).

The second control multiplexer M(1) has its 1 input connected to the output of the second delay stage S(1), and its 0 input connected to the output of the first control multiplexer M(0). The output of the second control multi-plexer M(1) is connected to the input of a load inverter 53 and the 1 input of the input multiplexer delay element E(2,1) of the third delay stage S(2). The select input of the second control multiplexer receives the second control bit C(1).

The third control multiplexer M(2) has its 1 input connected to the output of the third delay stage S(2), and its 0 input connected to the output of the second control multiplexer M(1). The output of the third control multiplexer M(2) is connected to the input of a load inverter 53 and the 1 input of the input multiplexer delay element E(3,1) of the fourth delay stage S(3). The select input of the third control multiplexer receives the third control bit C(2).

The fourth control multiplexer M(3) has its 1 input connected to the output of the fourth delay stage S(2), and its 0 input connected to the output of the third control multiplexer M(2). The select input of the fourth control multiplexer receives the fourth control bit C(3), and the output of the fourth control multiplexer M(3) is connected to the inputs of load inverters 53 and provides the output OUT of the delay line.

Thus, each of the outputs of the input multiplexer 51 and the control multiplexers M(0) through M(3) connect to loads that substantially match the loads seen by each of the multiplexer delay elements of the delay stages S(1) through S(3). The input multiplexer 51 and the control multiplexers M(0) through M(3) accordingly present a fixed delay of (L+1) delay elements; namely, $(L+1)*t_e$.

In operation, the variable delay line of FIG. 2 selects combinations of the delay stages S(0) through S(L-1) in accordance with the states of the bits C(0) through C(L-1) of the binary CONTROL word. If the control bit C(I) for a particular delay stage S(I) is a logical 1, the $2^I$ delay elements of that stage are serially connected together and that stage is included in the delay path between the 0 input to the input delay element 53 and the output of the control multiplexer M(L-1). If the control bit C(I) for a particular delay stage S(I) is a logical 0, the $2^I$ elements of that stage are bypassed from the delay path between the 0 input to the input multiplexer delay element 51 and the output of the control multiplexer M(L-1). In particular, the $2^I$ elements of a bypassed delay stage are not serially connected together, but instead receive preload inputs from the delay elements of the prior stage, as discussed earlier.

Each of the delay stages provides a delay of te, 2*te, 4*te, ... $2^{(L-1)}*te$, and the delay provided by the delay line as a function of values of the bits C(0) through C(L-1) of the control word is:

$$delay=(L+1)*te+C(0)*te+C(1)*2^1*te+C(2)*2^2*te+\ldots+C(L-1)*2^{(L-1)}*te$$

Thus, the adjustable delay provided by the variable delay line is an integral multiple of the delay te, and the maximum delay that can be provided by the variable delay line is:

$$maximum\ delay=(L+1)*te+2^L*te=(L+1+2^L)*te$$

The minimum delay that can be provided by the variable delay line is:

$$minimum\ delay=(L+1)*te$$

It is noted that for a binary controlled variable delay line 11 of FIG. 1 that is implemented in accordance with the variable delay of FIG. 2, the value of MIN that is subtracted by the substraction circuit 24 is equal to L+1. It is further noted that if number of bits L in the CONTROL word is an even number (in which case there would be an even number of delay stages), an inversion will occur, and an additional inverting multiplexer delay element 57 can be included at the output of the variable delay line to provide an output OUT of the variable delay line. If the additional inverting multiplexer 57 is included at the output of the variable delay line, MIN would be equal to L+2 and the first term in each of the foregoing three equations would be (L+2)*te.

The delay elements E(I,J) which have their 0 inputs connected to outputs of delay elements of a prior in sequence stage multiplexers of prior in sequence stages provide pre-loading paths whereby the inverting multiplexer delay elements of the stages not selected for inclusion in the delay path are pre-loaded by the digital signal that propagates through the delay line. Thus, when it is necessary to switch in a particular stage that is presently not included in the delay path, that stage will be in the same signal state as the stages presently included in the delay path. This avoids discontinuities (e.g., glitches) at the time such particular stage is switched into the delay path. The discontinuities that are thus avoided would otherwise propagate to the output of the delay line.

The foregoing has been a controllable delay line circuit that is advantageously utilized for on-chip generation of timing waveforms, whereby any clock frequency, pulse width, or edge placement may be realized through the use of precision fixed delays.

Although the foregoing has been a description and illustration of specific embodiments of the invention, various modifications and changes thereto can be made by persons skilled in the art without departing from the scope and spirit of the invention as defined by the following claims.

What is claimed is:

1. A binary controlled delay line responsive to L-bit control word having a predetermined number of bits starting with bit B(0) to bit B(L−1) comprising:

an input delay element (51) for receiving an input to the delay line and having an output;

a first delay stage S(0) comprised of at least one delay element having an input connected to the output of said input delay element, and having an output;

(L−1) delay stages S(1) through S(L−1) each respectively identified as a stage S(I) wherein I is an integer having a value of 1 through (L−1), each stage S(I) including $2^I$ serially connected substantially identical multiplexer delay elements E(I, J) wherein J is an integer having a value of 1 through $2^I$, each multiplexer delay element E(I, J) of each stage S(I) being responsive to bit B(I) of the L-bit control word, wherein a 1 input of each multiplexer delay element E(I,2) through E(I, J) is connected to the output of a prior in sequence delay element in a delay stage S(I), and wherein:

(b) the output of each odd numbered delay element E(I, J), wherein I is an integer having a value of 1 through (L−2), is connected to a zero input of delay element E(I+1, 2*J−1);

(c) the output of each even numbered delay element E(I, J), wherein I is an integer having a value of 1 through (L−2), is connected to a zero input of delay element E(I+1, 2*J−2) and a zero input of delay element E(I+1, 2*J);

a first two input control multiplexer M(0) having a 1 input connected to the output of said first delay stage S(0) and a 0 input connected to the output of said input delay element;

(L−2) substantially identical two input control multiplexers M(I), wherein I is an integer having a value of 1 through (L−2), each control multiplexer M(I) respectively responsive to the bit B(I) of the L-bit control word and having a 1 input connected to the output an associated delay stage S(I) and a 0 input connected to the output of a prior in sequence control multiplexer M(I−1), each control multiplexer further having an output connected to a 1 input of the delay element E(I+1, 1);

a two input control multiplexer M(L−1) respectively responsive to the bit B(L−1) of the L-bit control word and having a 1 input connected to the output of the associated delay stage S(L−1) and a 0 input connected to the output of a prior in sequence control multiplexer M(L−2), and further having an output for providing an output of the delay line.

2. The binary controlled delay line of claim 1 wherein each of the control multiplexers M(0) through M(L−2) further connected to a respective load.

3. The binary controlled delay line of claim 2 wherein the control multiplexer M(L−1) is further connected to two loads.

4. The binary controlled delay line of claim 1 wherein each of the outputs of the delay elements E(L−1, J) of the stage S(L−1) is further connected to two loads.

* * * * *